US007547569B2

(12) United States Patent
Weidman et al.

(10) Patent No.: US 7,547,569 B2
(45) Date of Patent: Jun. 16, 2009

(54) METHOD FOR PATTERNING MO LAYER IN A PHOTOVOLTAIC DEVICE COMPRISING CIGS MATERIAL USING AN ETCH PROCESS

(75) Inventors: Timothy Weidman, Sunnyvale, CA (US); Li Xu, Santa Clara, CA (US); Peter G. Borden, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/562,573

(22) Filed: Nov. 22, 2006

(65) Prior Publication Data

US 2008/0119005 A1    May 22, 2008

(51) Int. Cl.
*H01L 21/00* (2006.01)
*H01L 21/06* (2006.01)

(52) U.S. Cl. .............................. 438/48; 438/84; 438/102
(58) Field of Classification Search ................... 438/57, 438/48, 84, 102
See application file for complete search history.

(56) References Cited

U.S. PATENT DOCUMENTS

| | | | | |
|---|---|---|---|---|
| 3,726,956 | A * | 4/1973 | Silver | 423/4 |
| 4,599,154 | A * | 7/1986 | Bender et al. | 205/665 |
| 6,087,256 | A * | 7/2000 | Wada | 438/666 |
| 6,946,681 | B2 * | 9/2005 | Jeong et al. | 257/59 |
| 7,235,736 | B1 * | 6/2007 | Buller et al. | 136/251 |
| 7,259,865 | B2 * | 8/2007 | Cummings et al. | 356/503 |
| 2004/0263944 | A1 * | 12/2004 | Miles et al. | 359/290 |
| 2005/0253142 | A1 * | 11/2005 | Negami et al. | 257/65 |

OTHER PUBLICATIONS

"Etch," definition from Dictionary.com, Feb. 21, 2008.*
Chandra and Sahu, "Electrodeposited semiconducting molybdenum selenide films: I. Preparatory technique and structural characterization," J. Phys. D: App. Phys., 17:2115-2123 (1984).
Ohmori et al., "pH Dependent Controlled patterning of p-MoSe2 Surfaces by In-Situ Electrochemical Scanning Tunneling Microscopy," Langmuir, 14 (21):6287-6290 (1998).

* cited by examiner

*Primary Examiner*—Hsien-ming Lee
*Assistant Examiner*—Kevin Parendo
(74) *Attorney, Agent, or Firm*—Pillsbury Winthrop Shaw Pittman, LLP

(57) ABSTRACT

A processing method described herein provides a method of patterning a $MoSe_2$ and/or Mo material, for example a layer of such material(s) in a thin-film structure. According to one aspect, the invention relates to etch solutions that can effectively etch through Mo and/or $MoSe_2$. According to another aspect, the invention relates to etching such materials when such materials are processed with other materials in a thin film photovoltaic device. According to other aspects, the invention includes a process of etching Mo and/or $MoSe_2$ with selectivity to a layer of CIGS material in an overall process flow. According to still further aspects, the invention relates to Mo and/or $MoSe_2$ etch solutions that are useful in an overall photolithographic process for forming a photovoltaic cell and/or interconnects and test structures in a photovoltaic device.

14 Claims, 4 Drawing Sheets

METHOD FOR PATTERNING MO LAYER IN A PHOTOVOLTAIC DEVICE COMPRISING CIGS MATERIAL USING AN ETCH PROCESS

FIELD OF THE INVENTION

The present invention relates generally to photovoltaic devices, and more particularly to a method for etching a Mo layer in a photovoltaic device comprising CIGS material.

BACKGROUND OF THE INVENTION

Thin layers of material comprising Cu(In,Ga)Se, i.e. CIGS, are known to exhibit the highest photovoltaic conversion efficiency of any thin film material for a photovoltaic device (19.5%). See K. Ramanathan et al., "Properties of High-Efficiency CIGS Thin-Film Solar Cells," 31$^{st}$ IEEE Photovoltaics Specialists Conference and Exhibition, Lake Buena Vista, Fla., Jan. 3-7, 2005; and D. E. Tarrant et al., "CIS thin film development and product status at Shell Solar, May 2003," Proc. of 3$^{rd}$ WCPEC, Osaka, Japan, May 2003. Similar progress has been reported in the manufacturing area, where the efficiency of champion modules has exceeded 13% with yield above 80%. See M. Contreras et al., "High Efficiency Cu(In,Ga)Se$_2$-Based Solar Cells: Processing of Novel Absorber Structures," Proc. of 1$^{st}$ WCPEC, Hi., Dec. 5-9, 1994. Consequently, CIGS is considered by many in the art to be an attractive material for use in the manufacture of thin film photovoltaic panels.

In a typical solar cell module, as shown in FIG. 1A, a CIGS layer 106 is grown to a thickness of about 2 μm on an underlying metal layer 104 comprised of molybdenum (Mo). Mo provides good ohmic contact and has a similar thermal coefficient of expansion as CIGS, which can be important for the elevated temperature of CIGS processing. The Mo is usually deposited on a substrate material 102 which may be, for example, glass, stainless steel, or plastic. A range of concentrations of Cu, In, Ga and Se can be used in the CIGS layer, and sometimes the Ga is absent or S may be added. Accordingly, CIGS is used herein in its broadest possible meaning in the context of similar or related films. Moreover, other materials may be used in thin film photovoltaic modules, either individually or in combination, and either alternatively or additionally. These include CdTe, amorphous silicon (a:Si) and micro- or nano-crystal silicon (μc:Si). See generally, Y. Hamakawa (ed.), "Thin-Film Solar Cells," Chapter 10 (2004), the contents of which are incorporated herein by reference.

While the above-mentioned reported efficiencies of thin-film photovoltaic modules including CIGS are promising, there is a large gap between those numbers and actually-obtained efficiencies of known commercial photovoltaic modules containing CIGS. One problem is that laser and mechanical scribes are commonly used to pattern and form interconnects in thin-film photovoltaic modules, and these prior art processes have a number of drawbacks that limit module efficiency. For example, they create wide scribes, defects, and shunt current paths. Furthermore, they provide limited means for wiring the module in series-parallel arrangements that might reduce sensitivity to series resistance, shading losses or non-uniformity.

For these and other reasons, some have considered using lithographic patterning processes to form thin-film photovoltaic module interconnects. However, these processes would require the ability to etch Mo, and, in some cases, to do so selectively so that, for example, the etch will not induce excessive undercut of an overlying CIGS layer. The prior art literature provides scant reference to etching Mo in a CIGS solar cell, and is otherwise insufficient to solve this problem.

Moreover, it was not even known to etch CIGS in a solar cell until the invention of U.S. patent application Ser. No. 11/395,080 (AMAT-10936), the contents of which are incorporated herein by reference. While this invention dramatically advanced the state of the art of thin-film photovoltaic modules, and also mentions etching Mo, additional problems have arisen that were not seriously addressed before that invention.

For example, as shown in FIG. 1B, certain CIGS growing processes can include selenium annealing at high temperature. In such processing, a MoSe$_2$ layer 108 is formed at the interface between the CIGS layer 106 and Mo layer 104.

When such a MoSe$_2$ layer is formed, both the Mo layer and this additional MoSe$_2$ layer need to be removed during processing, and ideally using an etch. Again, the prior art literature is insufficient for overcoming this newly-observed problem. For example, T. Ohmori et al., in their article entitled "pH Dependent Controlled patterning of p-MoSe$_2$ Surfaces by In-Situ Electrochemical Scanning Tunneling Microscopy," Langmuir, 14 (21), 6287-6290 (1998) propose using a solution of 0.05M NH$_3$ and 0.025M KNO$_3$ with the assistance of a high electrical field induced between an Atomic Force Microscope (AFM) tip and a MoSe$_2$ surface. For a typical gap of 2 nm between the AFM tip and the substrate and with the reported etching threshold voltage of 0.3V, the electrical field is as high as 1.5×10$^8$ V/m which is unsuitable for application to macro-scale processes such as photovoltaic module fabrication. Likewise, S. Chandra and S. N. Sahu, in their paper entitled "Electrodeposited semiconducting molybdenum selenide films: I. Preparatory technique and structural characterization," J. Phys. D: App. Phys., Vol. 17 (1984), pp. 2115-2123, propose an electro-deposition method of MoSe$_2$ films. While the article implies a MoSe$_2$ etch in basic solutions, no etch recipe is given, and in any event it does not describe a useful process for photovoltaic module fabrication.

Therefore, there remains a need in the art to overcome many of the shortcomings of the conventional processes for etching an underlying metal Mo layer in a thin-film photovoltaic device having CIGS material. The present invention aims at doing this, among other things.

SUMMARY OF THE INVENTION

The present invention provides a method of patterning a MoSe$_2$ and/or Mo material, for example a layer of such material(s) in a thin-film structure. According to one aspect, the invention relates to etch solutions that can effectively etch through Mo and/or MoSe$_2$. According to another aspect, the invention relates to etching such materials when such materials are processed with other materials in a thin film photovoltaic device. According to other aspects, the invention includes a process of etching Mo and/or MoSe$_2$ with selectivity to a layer of CIGS material in an overall process flow. According to still further aspects, the invention relates to Mo and/or MoSe$_2$ etch solutions that are useful in an overall photolithographic process for forming a photovoltaic cell and/or interconnects and test structures in a photovoltaic device.

In furtherance of these and other objects, a method of processing a thin-film structure according to the invention includes etching a thin film layer in the thin-film structure, wherein the thin film layer comprises molybdenum. In certain embodiments, the etched thin film layer further comprises selenium. In other embodiments, the etched thin film layer comprises Mo and MoSe$_2$. In additional embodiments, the method further includes defining a masking layer so as to pattern the thin film layer. In other embodiments, the thin-film structure includes a photovoltaic film such as CIGS.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Generally, the present inventors have discovered several etch solutions that can effectively etch through Mo and/or MoSe$_2$, and particularly when such materials are patterned during photolithographic processing with other materials such as CIGS in a thin film photovoltaic device.

Figure 1A:
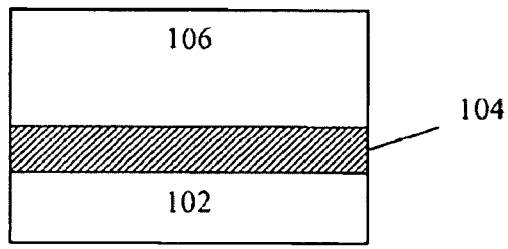
FIGS. 1A and 1B illustrate certain aspects of the processing of thin-film structures including CIGS and an underlying conductor.
Figure 1B:
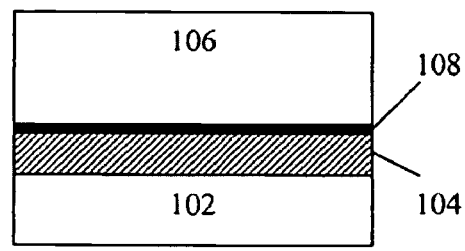
Figure 2A:
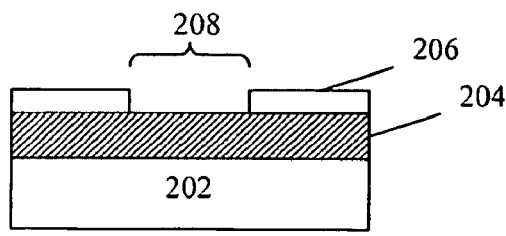
FIGS. 2A and 2B illustrate an example process of etching a Mo/MoSe$_2$ material in accordance with one embodiment of the invention.
Figure 2B:
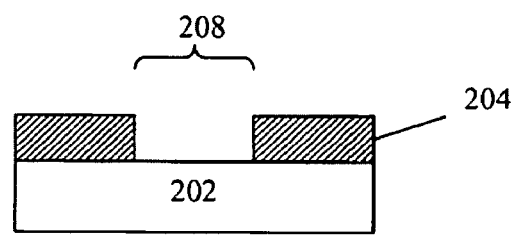

FIGS. 2A and 2B illustrate a first example embodiment for patterning Mo and/or MoSe$_2$ in accordance with the invention. In this example, an etch system comprising a 1:1 combination of H$_2$O$_2$ and NH$_4$(OH) is prepared for use. It should be noted that the below described drawings are not to scale, and relative dimensions of various layers and features will be specified in the descriptions where examples are appropriate. The drawings are intended for illumination rather than limitation.

As shown in FIG. 2A, a thin-film Mo and/or MoSe$_2$ layer 204 is prepared on a substrate 202 using any one of a known number of thin-film techniques such as sputtering, evaporation, chemical vapor deposition or plating, for example. It should be noted that one or more thin-film layers of other materials may be included, above and/or below the Mo layer 204 with respect to the underlying substrate. A mask 206 is suspended on or over the substrate, the mask including an aperture 208 representing a portion of a desired pattern. The above-described H$_2$O$_2$/NH$_4$(OH) etch system is used to etch the thin-film structure through the aperture. Other etch systems may be needed to etch through other layers if they exist in this structure. For example, a staged etch process may be used.

As shown in FIG. 2B, the etch system above completely etches the structure corresponding to the mask aperture 208 through the Mo layer 204 and possibly down to the substrate 202. The mask can then be removed and/or the same or other masks used to further process the thin-film structure.

While the etch system of this embodiment of the invention completely and successfully etches Mo and MoSe$_2$, its etch selectivity between MoSe$_2$/Mo and certain masks such as certain types of photoresist is low, and so such masks or photoresists may be heavily damaged using this etch solution. Accordingly, the mask may not be usable for subsequent processing and may need to be removed after the etch. Accordingly, the usefulness of this etch system may be limited in patterning applications such as photolithographic processing.

Moreover, when one of the layers other than Mo/MoSe$_2$ in the thin-film structure is a CIGS layer, the exposed CIGS film will induce intense reaction of CIGS and H$_2$O$_2$, which causes the process to become very hard to control and can result in severe undercut of the CIGS film.

Another preferred embodiment of the invention is shown in FIGS. 3A-3F. This embodiment is illustrated in connection with an example process flow of forming a CIGS thin film solar cell. While the etch process of this embodiment provides many advantages in such a process flow, the invention is not limited to this particular application.

Figure 3:
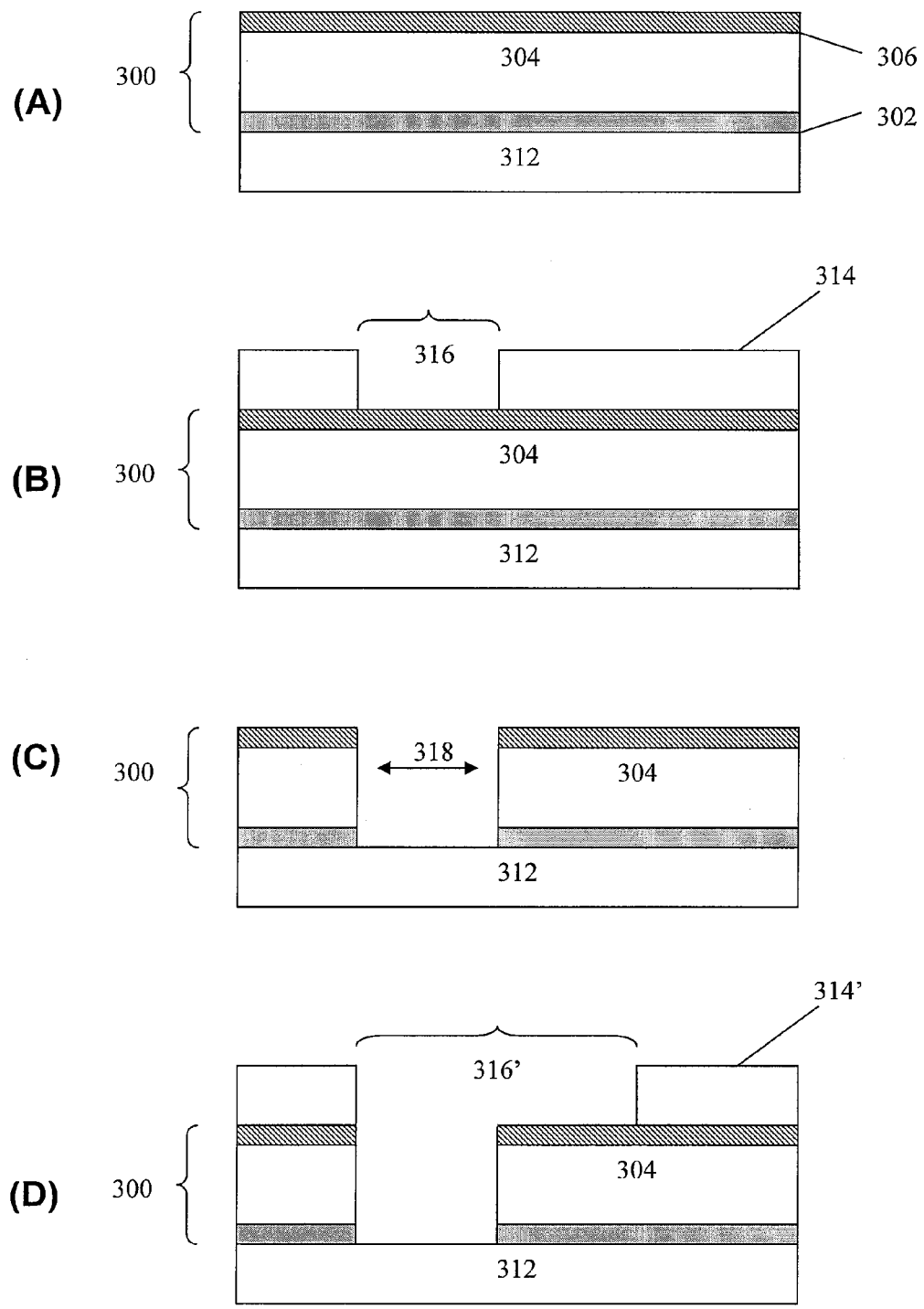
FIGS. 3A-I show a method of forming a thin film photovoltaic module including an underlying Mo/MoSe$_2$ conductor using a photolithographic etch process in accordance with an embodiment of the invention.
Figure 3:
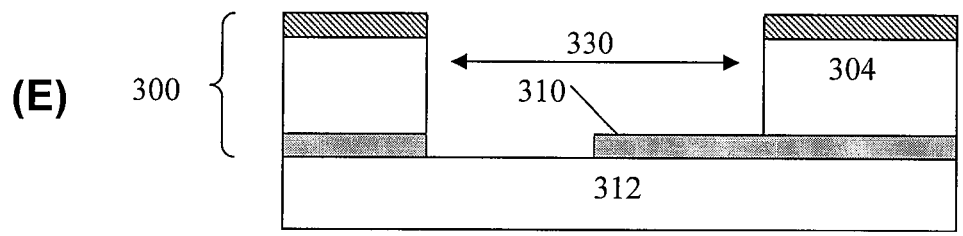
Figure 3:
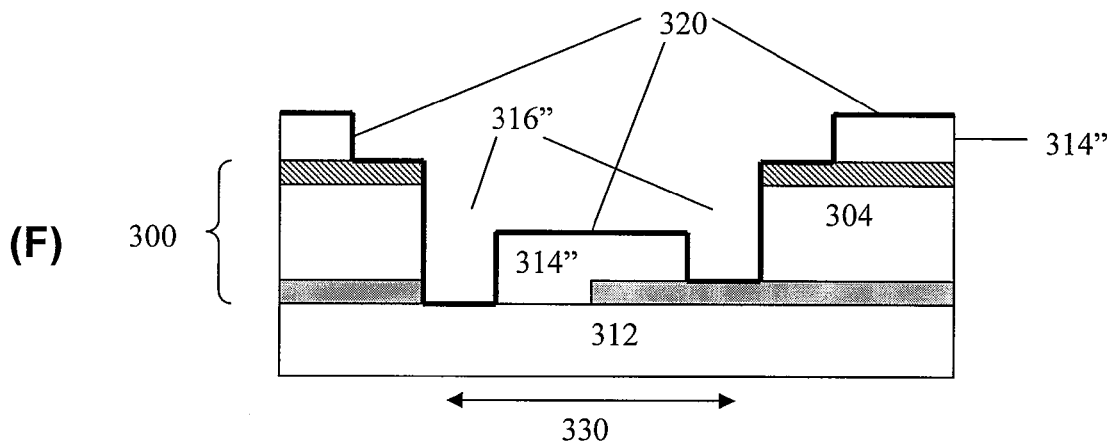
Figure 3:
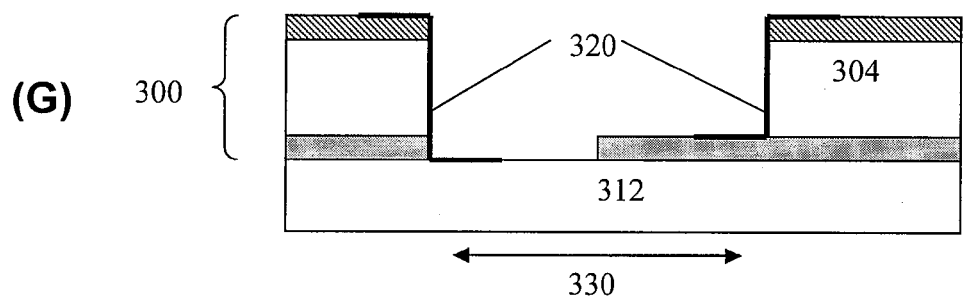
Figure 3:
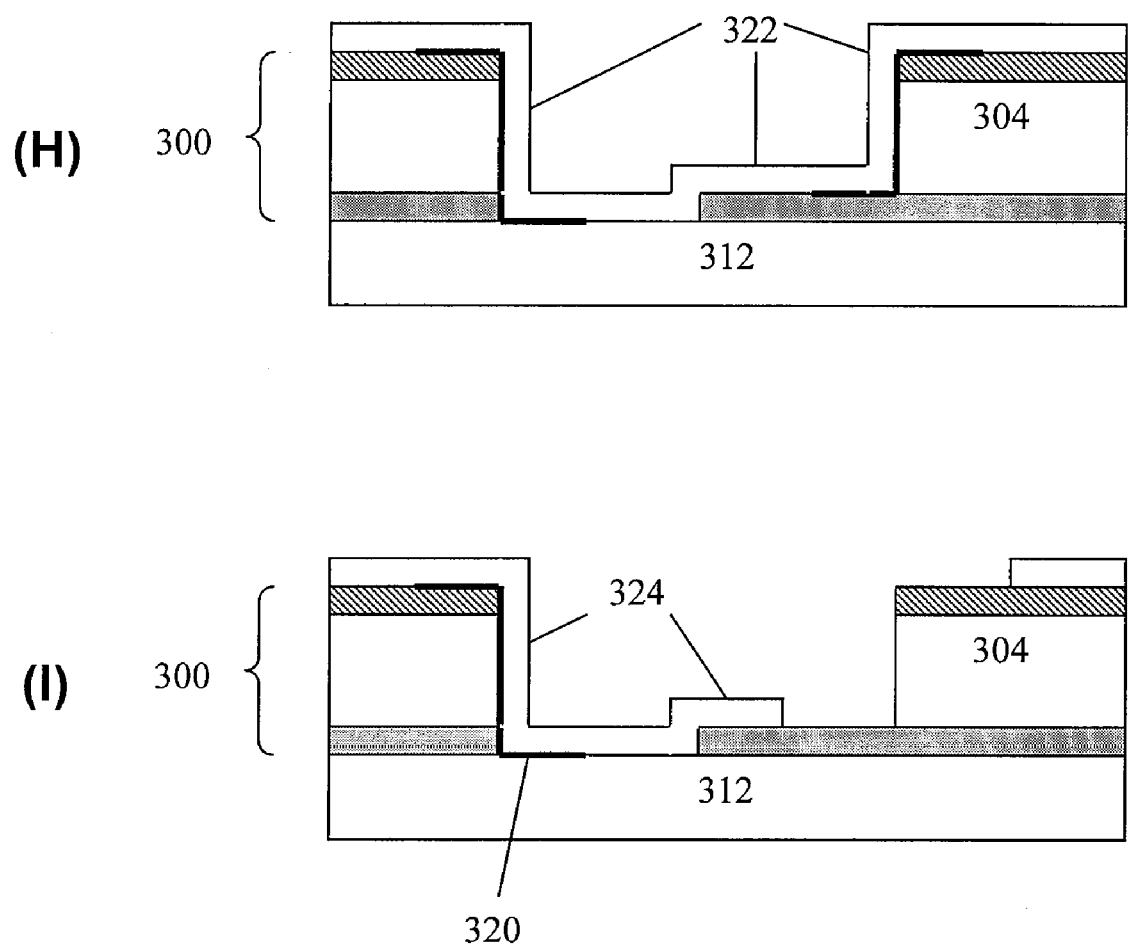

The process starts as shown in FIG. 3A, where a starting material comprising stack 300 is formed on a substrate 312 such as a 3 mm thick sheet of soda lime glass (SLG). As shown, stack 300 includes a 1 μm layer 302 of Mo, corresponding to the opaque metal electrode in contact with the glass substrate 312, a 2 μm CIGS semiconducting or absorbing layer 304, under a 0.07 μm buffer layer 306 of CdS. While the use of CIGS is illustrative of certain aspects of this embodiment, any other appropriate semiconducting or absorbing material including micromorph, CIS, α:Si, μC:Si, CdTe, or stacks of multiple materials, could also be used, and the buffer layer need not be included.

It should be noted that before CIGS material deposition, in some embodiments a thin compound layer containing Se is first deposited on top of thee Mo film to act as a seeding layer for CIGS growth. In this example process, Se atoms diffuse into Mo and can form a MoSe2 layer (not shown) at the interface between CIGS layer 304 and the Mo layer 302.

The next step in the process flow is to make an isolation cut through the stack 300 to the glass. According to an aspect of this embodiment of the invention, photolithographic processing is used. For example, in this embodiment shown in FIG. 3B, a layer 314 of photoresist is applied to the module, for example by spinning a layer of Shipley 3612 photoresist on the sample. The thickness of the photoresist may be 1-10 μm. Lines 316, for example 10 μm wide, are exposed in the photoresist using, for example, a photolithographic mask (not shown) with a corresponding aperture suspended above or in contact with the substrate.

In this example application of forming a photovoltaic module, these lines 316 are used to divide the module into cells and can run the entire length of the module. These lines are also used in the process of forming interconnects between cells as will be described in more detail below. It should be noted that in this step, many hundreds of these lines substantially parallel to each other can be formed on the module. Moreover, other lines and patterns may be made during this step, for example corresponding to test structures and lines for parallel wiring arrangements. Discussions of such other alternative or additional processing will be omitted here for the sake of clarity of the invention.

As shown in FIG. 3C, after hard bake of the photoresist, a staged etch process is used to form the isolation cut. First, the CIGS film 304 is etched with, for example, a mixture of 98% concentration $H_2SO_4$ and 30% concentration $H_2O_2$ at the ratio of 5:1 at 40 C and/or other techniques as described in co-pending application Ser. No. 11/395,080 (AMAT-10936).

According to an aspect of the invention, the same photoresist mask can also be used as an etch mask for a subsequent wet etch of the $MoSe_2$/Mo layer 302. For the $MoSe_2$/Mo etch, the present inventors have discovered that a strong oxidizer solution of NaClO, for example as that solution is found in bleach such as Clorox® bleach, is able to remove the Mo layer as well as the thin $MoSe_2$ layer that is present in the CIGS solar cells of certain embodiments. The etch rate is about 10 Å/sec and takes less than 2 minutes to cleanly remove $MoSe_2$/Mo films having a thickness of approximately 1 μm.

In general it is desirable to have at least 5:1 etch rate selectivity between $MoSe_2$/Mo and both CIGS and the photoresist, in order to have a wide enough process window to minimize the undercut of CIGS. It is found that this selectivity is obtained for Mo and Shipley 3612 photoresist with the above described NaClO solution (i.e. Clorox® bleach). Therefore, it is possible to perform an etch using this etch system and using a photoresist mask for patterning the Mo layer.

FIG. 3D illustrates a next step which begins a process of forming a conductive step or contact step according to one preferred embodiment of forming a photovoltaic device. As shown in FIG. 3D, this includes depositing another layer of photoresist 314', which can be the same Shipley 3612 photoresist as photoresist layer 314, and the application process can be a spin-on process as described above. Next, a second aperture 316' that is aligned with one side of the first narrower aperture 316 is patterned in the photoresist.

For example, in accordance with techniques described in more detail in co-pending application Ser. No. 11/394,721 (AMAT-10668), the contents of which are incorporated herein by reference, a reflector or mirror is placed in close proximity to the top surface (e.g. 50 μm) and the illumination is incident from the under side of the glass substrate 312 at an angle. The light reflects from the mirror and exposes a region of photoresist adjacent to the already formed scribe 318. Therefore, this exposure is self-aligned to the existing scribe, and creates a 30 μm wide aperture in the module having one edge corresponding to the line 318.

As shown in FIG. 3E, following exposure, development and removal of the photoresist region, an etch is performed through the exposed structure to form the conductive step 310 and interconnect groove 330. This etch may be done using the mixture described above comprising 98% concentration $H_2SO_4$ and 30% concentration $H_2O$ at the ratio of 5:1 at 40 C, and/or other wet or dry etch techniques as described in co-pending application Ser. No. 11/395,080 (AMAT-10936). In some embodiments, the etch is stopped when the Mo layer 302 is reached. In other cases, the etch may be stopped in the semiconductor layer. For example, in α:Si or μC:Si the semiconductor is heavily doped near the bottom, and contact to this heavily doped region is acceptable. The heavily doped region can be left with metal to form interconnects due to the region's good electric conductivity.

It should be noted that other wet etch solutions may be possible, as well as dry etch processes. Although dry etches are commonly used in lithographic processing, they are generally more costly than wet etches. Dry etches usually involve chemical reactions using ions in a plasma to create volatile by-products. Moreover, the dry etch equipment may not be available for large substrate processes. An advantage of the wet etch process examples provided herein is that they include the use of inexpensive chemicals such as sulphuric acid and peroxide. It is also possible to use plasma etching to remove these films, but the cost of the equipment would be much higher than wet etch processes.

In the next step shown in FIG. 3F, processing continues by applying an insulator to the exposed edges or walls of the CIGS semiconductor layer 304 adjacent to the interconnect groove 330 between cells. More specifically, in the embodiment shown in FIG. 3F, resist 314" is deposited and then patterned to expose the CIGS edges through openings 316". As should be apparent, an aligned lithographic process such as that described in FIGS. 3B and 3D can be performed to pattern the resist and create openings 316". In this example, however, a lift-off resist such as ProLift 100 from Brewer Science is preferably used, as will become more apparent from below. A thin insulator layer 320 such as $SiO_2$ or $Al_2O_3$ is then sputtered to a thickness of 500 Å.

Removing the photoresist lifts off the insulator deposited thereon, leaving portions of insulator 320 on the opposing walls of the CIGS layer adjacent to the interconnect groove 330 that were exposed through openings 316", as shown in FIG. 3G.

A layer 322 of a transparent conductor such as 0.7 μm of aluminum doped zinc oxide (AZO) is deposited over the surface of the stack 300 in a next step shown in FIG. 3H.

In a next step shown in FIG. 3I, the layer 322 is patterned (e.g. using lithographic techniques as described in FIGS. 3B and 3D, for example), to form a series connection 324 between adjacent cells. As shown in FIG. 3I, the insulator material 320 underlies the connection 324, thus eliminating the current shunt path formed between the connection 324 and the portion of the CIGS layer 304 and the underlying Mo conductor 302 abutting the sidewall edge of the cell.

It should be noted that, in addition to dividing cells and forming interconnects, the etch and patterning processes described above can be used to form test structures, for example, adjacent to the active area, or even in a small portion of the active area. For example, the etching can be used to isolate a small portion of a deposited film, so that properties such as thickness or conductivity can be measured. In some cases, an earlier deposition may be etched away in an earlier process step, so that a later deposition is formed on the glass substrate, allowing the later deposition to be electrically isolated, with underlayers absent. This allows intermediate process parameters to be measured by probing before the full process is complete.

Moreover, as set forth in co-pending application Ser. No. 11/395,080 (AMAT-10936), the CIGS etch and patterning process described above may also be used for other purposes. For example, the process can be used to form contact pads or to place small surface-mount protect diodes. In addition, it is possible to perform the process of edge isolation while performing the cell division using the CIGS etch process. Edge isolation is the process of removing deposited layers from the edges of the module, so they will not run over the edge and short out. This process is normally done using laser scribing, but can be included in the cell division etch process (e.g. as shown in FIGS. 3D and 3E) by adjusting the mask to expose the periphery of the module. In addition, an insulator such as insulator 320 can be formed over the edge isolation at no additional cost in order to passivate the exposed edge, thus reducing edge leakage and making the exposed edge impervious to contamination.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A method of processing a thin-film structure comprising:
    preparing a metal layer in the thin-film structure, wherein the metal layer comprises one or both of Mo and $MoSe_2$;
    preparing a photovoltaic layer in the thin-film structure; and
    etching the prepared metal layer and the prepared photovoltaic layer using a wet etch solution comprising NaClO to thereby remove portions of the metal layer and completely expose a corresponding portion of the thin-film structure underlying the metal layer,
    wherein an etch rate at which the etching removes the metal layer is at least 5 times greater than an etch rate at which the etching removes the photovoltaic layer.

2. A method according to claim 1, further including defining a masking layer so as to pattern the metal layer and thereby define the etched portion of the metal layer.

3. A method according to claim 2, wherein the step of defining the masking layer includes depositing a photoresist layer and using photolithography to create a pattern, and wherein the etch rate at which the etching removes the metal layer is at least 5 times greater than an etch rate at which the etching removes the photoresist layer.

4. A method according to claim 1, wherein the etching step includes using a wet etch chemistry.

5. A method according to claim 4, wherein the etched metal layer comprises a conducting film in a solar cell stack.

6. A method according to claim 4, wherein the photovoltaic layer comprises copper, indium, and selenium.

7. A method according to claim 4, wherein the thin-film structure further comprises a different layer comprising CdTe.

8. A method according to claim 4, wherein the photovoltaic layer comprises amorphous silicon.

9. A method according to claim 4, wherein the photovoltaic layer comprises micro- or nano-crystal silicon.

10. A method according to claim 1, wherein the etching step includes using a dry etch chemistry.

11. A method according to claim 1, wherein the etch rate of the metal layer is in excess of 5 Å/sec.

12. A method according to claim 1, wherein the etching step further includes forming test structures in the thin film structure.

13. A method according to claim 12, wherein intermediate layers in the thin-film structure are removed so that the test structures are formed on a base that includes fewer layers than areas of the thin-film structure in which the intermediate layers are not removed.

14. A method according to claim 12, wherein the test structures are electrically isolated from a photovoltaic device formed in the thin-film structure.

* * * * *